United States Patent
Kim et al.

(10) Patent No.: US 8,193,695 B2
(45) Date of Patent: Jun. 5, 2012

(54) ORGANIC LIGHT EMITTING DEVICE AND MANUFACTURING METHOD THEREOF

(75) Inventors: Soo-Hyun Kim, Cheonan-si (KR); Sun Park, Hwaseong-si (KR); Chun-Gi You, Hwaseong-si (KR); Jong-Hyun Park, Yongin-si (KR); Dong-Ki Lee, Seongnam-si (KR); Yul-Kyu Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 12/468,597

(22) Filed: May 19, 2009

(65) Prior Publication Data

US 2010/0013383 A1 Jan. 21, 2010

(30) Foreign Application Priority Data

Jul. 17, 2008 (KR) .................. 10-2008-0069621
Nov. 14, 2008 (KR) .................. 10-2008-0113366

(51) Int. Cl.
*H01J 1/64* (2006.01)
(52) U.S. Cl. .................. 313/503; 313/506; 313/505
(58) Field of Classification Search .................. 313/503, 313/505, 506
See application file for complete search history.

(56) References Cited

U.S. PATENT DOCUMENTS

| | | | |
|---|---|---|---|
| 6,133,581 A * | 10/2000 | Terao et al. .................. | 313/505 |
| 6,639,250 B1 | 10/2003 | Shimoda | |
| 7,023,013 B2 | 4/2006 | Ricks | |
| 7,030,553 B2 | 4/2006 | Winters | |
| 7,129,634 B2 * | 10/2006 | Boroson et al. .................. | 313/504 |
| 7,247,394 B2 | 7/2007 | Hatwar | |
| 7,301,276 B2 * | 11/2007 | Yamazaki et al. .................. | 313/506 |
| 7,459,847 B2 * | 12/2008 | Kurosawa et al. .................. | 313/504 |
| 7,830,476 B2 * | 11/2010 | Park .................. | 257/59 |
| 2005/0017630 A1 * | 1/2005 | Ryu et al. .................. | 313/504 |
| 2006/0147650 A1 * | 7/2006 | Park .................. | 428/1.1 |
| 2007/0102737 A1 * | 5/2007 | Kashiwabara et al. ....... | 257/291 |
| 2009/0128023 A1 * | 5/2009 | Kwak et al. .................. | 313/504 |
| 2009/0200922 A1 * | 8/2009 | Lee et al. .................. | 313/504 |
| 2010/0026178 A1 * | 2/2010 | Hwang et al. .................. | 313/506 |

FOREIGN PATENT DOCUMENTS

| | | |
|---|---|---|
| JP | 06275381 | 9/1994 |
| JP | 2001071558 | 3/2001 |
| JP | 2005197009 | 7/2005 |
| JP | 2005197010 | 7/2005 |
| JP | 2005197011 | 7/2005 |
| JP | 200752971 | 3/2007 |
| KR | 1020060079225 | 7/2006 |
| KR | 1020060109345 | 10/2006 |
| KR | 100657396 | 12/2006 |
| KR | 100721052 | 5/2007 |
| KR | 1020070111349 | 11/2007 |

* cited by examiner

*Primary Examiner* — Peter Macchiarolo
(74) *Attorney, Agent, or Firm* — H.C. Park & Associates, PLC

(57) ABSTRACT

The present invention relates to an organic light emitting device and a manufacturing method thereof. A method of manufacturing an organic light emitting device according to an exemplary embodiment of the present invention includes: respectively forming first, second, and third driving transistors in a first region, a second region, and a third region on a substrate; forming an insulating layer on the first to third driving transistors; respectively forming first, second, and third pixel electrodes on the insulating layer, the first, second, and third pixel electrodes being formed in the first, second, and third regions, respectively; forming an auxiliary electrode on a side surface of each of the first, second, and third pixel electrodes; forming an organic light emitting member on the first to third pixel electrodes; and forming a common electrode on the organic light emitting member.

26 Claims, 14 Drawing Sheets

ORGANIC LIGHT EMITTING DEVICE AND MANUFACTURING METHOD THEREOF

CROSS REFERENCE TO RELATED APPLICATION

This application claims priority from and the benefit of Korean Patent Application No. 10-2008-0069621, filed on Jul. 17, 2008, and Korean Patent Application No. 10-2008-0113366 filed on Nov. 14, 2008, which are hereby incorporated by reference for all purposes as if fully set forth herein.

BACKGROUND OF THE INVENTION

1. Field of the Invention

The present invention relates to an organic light emitting device and a manufacturing method thereof.

2. Discussion of the Background

An organic light emitting device includes a plurality of pixels, and each pixel includes an organic light emitting element and a plurality of thin film transistors (TFTs) for driving it.

The organic light emitting element includes an anode, a cathode, and an organic light emitting member disposed therebetween, and the organic light emitting member emits light of three primary colors including red light, green light, and blue light, or white light. Materials used in the organic light emitting member may vary according to the colors emitted by the organic light emitting member, and a method of emitting white light in which light emitting materials that emit red light, green light, and blue light are stacked so that the synthesized light becomes white may be used. Moreover, in a case where the organic light emitting member emits a white light, a color filter may be added to obtain light of a desired color.

However, due to the material characteristics of the organic light emitting element or light interference of the thin films through which light passes, the light emitted from each pixel may not satisfy the light characteristic conditions required for an organic light emitting device. For example, the wavelength or the color purity of emitted light may not be satisfactory.

SUMMARY OF THE INVENTION

The present invention provides an organic light emitting device and a manufacturing method thereof.

Additional features of the invention will be set forth in the description which follows, and in part will be apparent from the description, or may be learned by practice of the invention.

The present invention discloses an organic light emitting device including: a substrate including a first region, a second region, and a third region; a first driving transistor, a second driving transistor, and a third driving transistor arranged on the substrate, and respectively disposed in the first region, the second region, and the third region; an insulating layer arranged on the first driving transistor, the second driving transistor, and the third driving transistor; a first pixel electrode, a second pixel electrode, and a third pixel electrode arranged on the insulating layer, and respectively disposed in the first region, the second region, and the third region; a first auxiliary electrode, a second auxiliary electrode, and a third auxiliary electrode respectively covering a side surface of the first pixel electrode, the second pixel electrode, and the third pixel electrode; an organic light emitting member arranged on the first pixel electrode, the second pixel electrode, and the third pixel electrode; and a common electrode arranged on the organic light emitting member.

The present invention also discloses an organic light emitting device including: a thin film structure arranged on a substrate; a pixel electrode arranged on the thin film structure and including a metal layer and a transparent conductor layer arranged on the metal layer; a auxiliary electrode covering the metal layer; an organic light emitting member arranged directly on the pixel electrode; and a common electrode arranged on the organic light emitting member.

The present invention also discloses a method of manufacturing an organic light emitting device including: respectively forming a first driving transistor, a second driving transistor, and a third driving transistor in a first region, a second region, and a third region on a substrate; forming an insulating layer on the first driving transistor, the second driving transistor, and the third driving transistor; forming a first pixel electrode, a second pixel electrode, and a third pixel electrode on the insulating layer, the first pixel electrode, the second pixel electrode, and the third pixel electrode being formed in the first region, the second region, and the third region, respectively; forming a conductive protecting member on a side surface of each of the first pixel electrode, the second pixel electrode, and the third pixel electrode; forming an organic light emitting member on the first pixel electrode, the second pixel electrode, and the third pixel electrode; and forming a common electrode on the organic light emitting member.

The present invention also discloses a method of manufacturing an organic light emitting device including: respectively forming a first driving transistor, a second driving transistor, and a third driving transistor in a first region, a second region, and a third region on a substrate; forming an insulating layer on the first driving transistor, the second driving transistor, and the third driving transistor; forming a first pixel electrode, a second pixel electrode, and a third pixel electrode on the insulating layer, the first pixel electrode, the second pixel electrode, and the third pixel electrode being formed in the first region, the second region, and the third region, respectively; forming a conductive protecting member on a side surface of each of the first pixel electrode and the second pixel electrode and on a side surface and an upper surface of the third pixel electrode; forming an organic light emitting member on the first pixel electrode, the second pixel electrode, and the third pixel electrode; and forming a common electrode on the organic light emitting member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
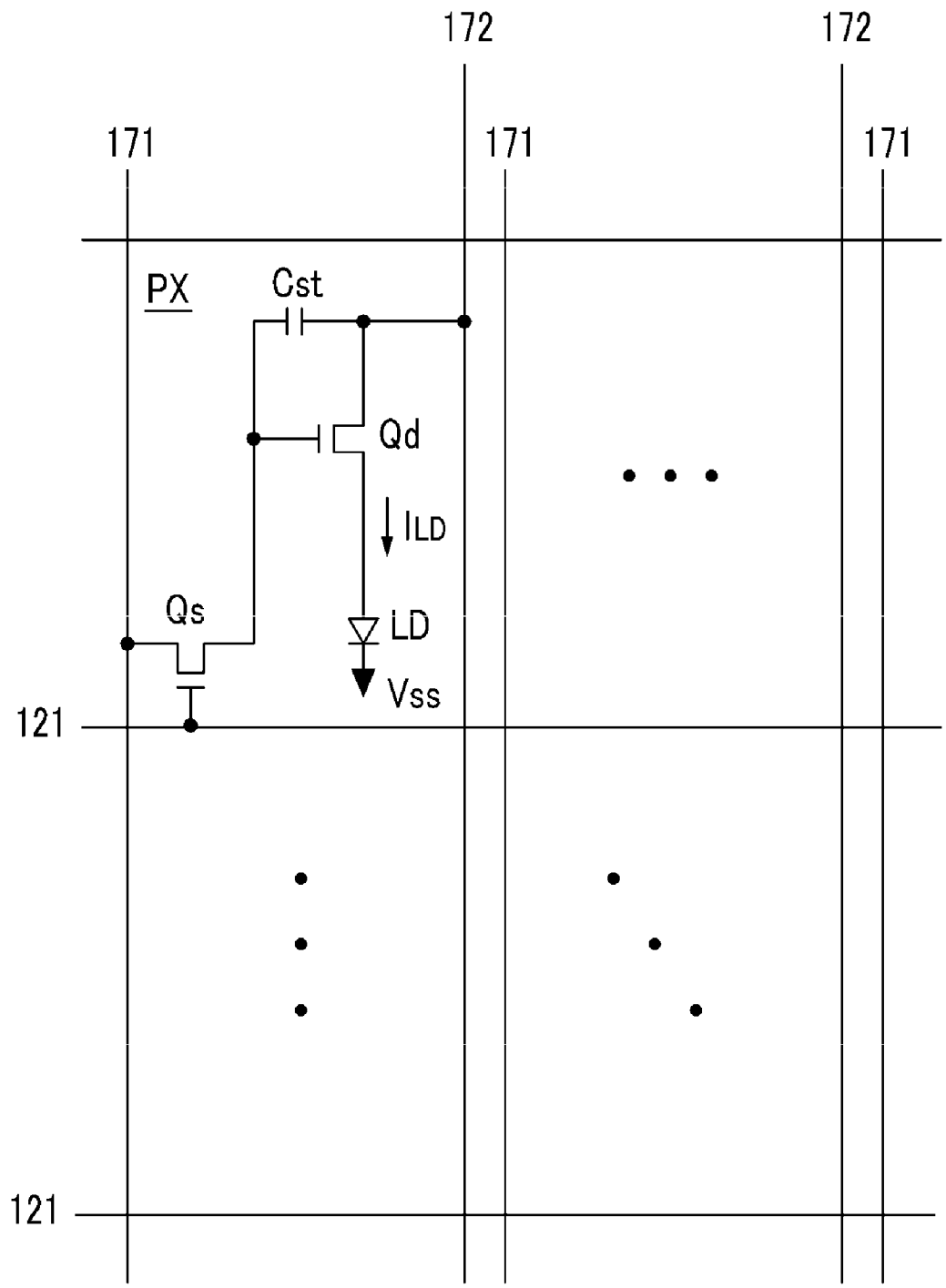
FIG. 1 is an equivalent circuit schematic diagram of an organic light emitting device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described below with reference to FIG. 1.

FIG. 1 is an equivalent circuit schematic diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend in a row direction and are substantially parallel to each other, and the data lines 171 extend in a column direction and are substantially parallel to each other. The driving voltage lines 172 extend in a column direction and are substantially parallel to each other. However, the driving voltage lines 172 may extend in the row direction or the column direction, and in a mesh shape.

Each pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current $I_{LD}$ having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage Vss. The organic light emitting element LD emits light having an intensity depending on an output current $I_{LD}$ of the driving transistor Qd, thereby displaying images.

The switching transistor Qs and the driving transistor Qd are n-channel field effect transistors (FETs), however at least one may be a p-channel FET. In addition, the connections among the transistors Qs and Qd, the capacitor Cst, and the organic light emitting diode LD may be modified.

Other transistors for compensating the threshold voltage of the driving transistor Qd or the organic light emitting element LD may be included in addition to as the switching transistor Qs and the driving transistor Qd.

The detailed structure of an organic light emitting device according to an exemplary embodiment of the present invention will be described below with reference to FIG. 2 as well as FIG. 1.

Figure 2:
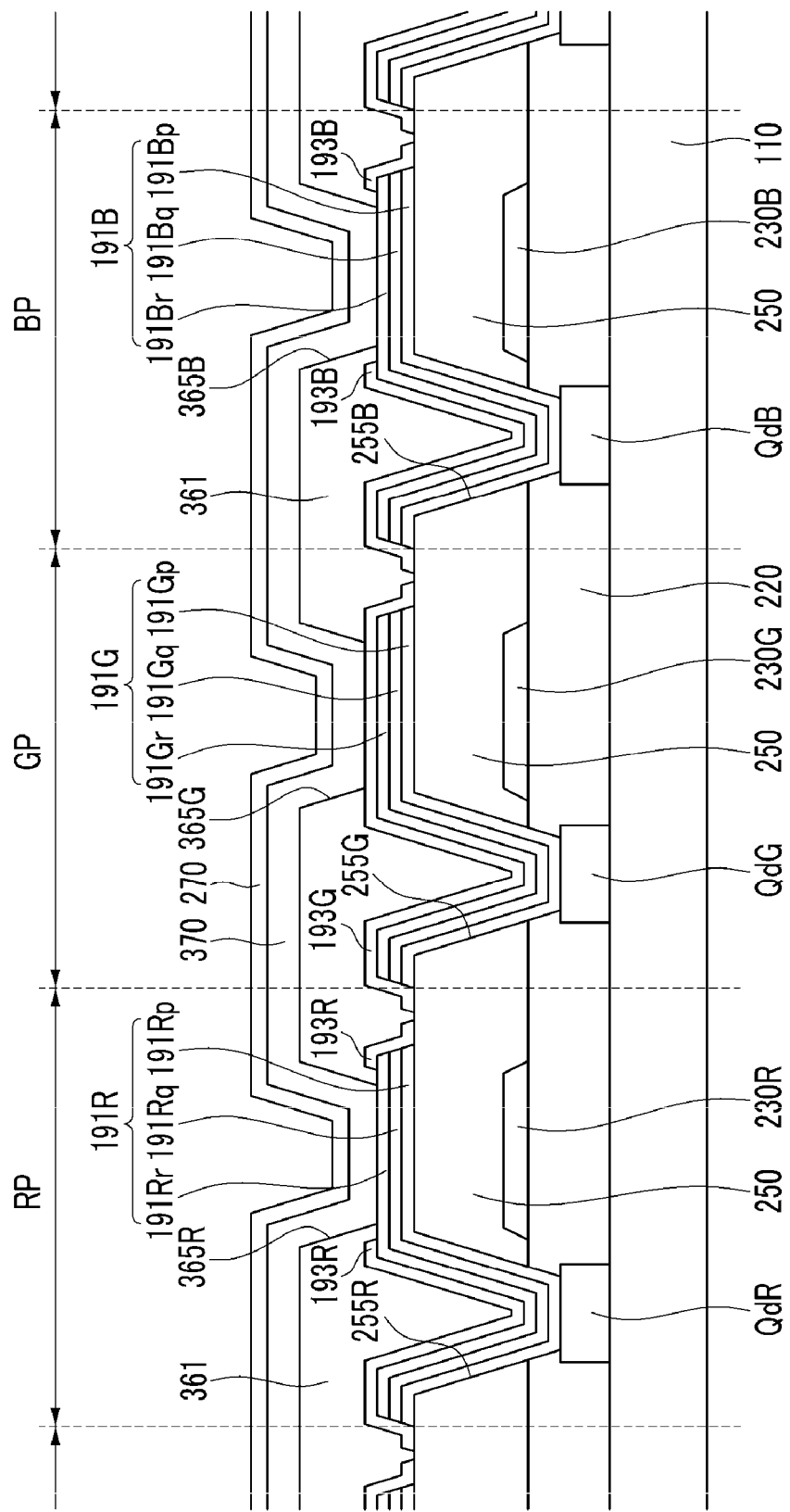
FIG. 2 is a cross-sectional view showing the organic light emitting device according to an exemplary embodiment of the present invention.

FIG. 2 is a cross-sectional view of an organic light emitting device according to an exemplary embodiment of the present invention.

An organic light emitting device according to the present exemplary embodiment includes a red pixel RP, a green pixel GP, and a blue pixel BP. Three different primary colors may be included instead of the three primary colors of red, green, and blue.

In the drawings, portions of the organic light emitting device related to the red pixel R, the green pixel G, and the blue pixel B have "R", "G", and "B" respectively attached to each reference numeral with respect thereto.

A plurality of driving transistors QdR, QdG, and QdB are formed on an insulation substrate 110 made of transparent glass or plastic. Other thin film structures 220 including switching transistors are also formed on the substrate 110. The thin film structures 220 may include an insulating layer covering the driving transistors, and other thin film structures may be formed under the driving transistors QdR, QdG, and QdB.

A red color filter 230R, a green color filter 230G, and a blue color filter 230B are formed on the thin film structures 220, and an overcoat 250 is formed on the color filters 230R, 230G, and 230B and the thin film structures 220. The overcoat 250 may be made of an organic material and have a flat surface. A plurality of through holes 255R, 255G, and 255B exposing the driving transistors QdR, QdG, and QdB are formed in the overcoat 250 and the thin film structures 220.

A plurality of pixel electrodes 191R, 191G, and 191B are formed on the overcoat 250. Each pixel electrode 191R, 191G, and 191B has a three-layered structure including a lower layer 191Rp, 191Gp, and 191Bp, a middle layer 191Rq, 191Gq, and 191Bq, and an upper layer 191Rr, 191Gr, and 191Br. The pixel electrodes 191R, 191G, and 191B are connected to the driving transistors QdR, QdG, and QdB through the contact holes 255R, 255G, and 255B, respectively.

The lower layers 191Rp, 191Gp, and 191Bp may be made of a metal oxide such as polycrystalline indium tin oxide (ITO) or indium zinc oxide (IZO), and the thickness thereof may be in the range of about 50-150 Å, and particularly about 75 Å. The lower layers 191Rp, 191Gp, and 191Bp protect the middle layers 191Rq, 191Gq, and 191Bq from oxygen or moisture that may flow from the overcoat 250. The lower layers 191Rp, 191Gp, and 191Bp may be made of an organic material, and may be omitted.

The middle layers 191Rq, 191Gq, and 191Bq may be made of a metal having high reflectance such as silver (Ag), a magnesium-silver (Mg:Ag) alloy, and aluminum (Al), and the thickness thereof is in the range of about 125-250 Å, and particularly about 200 Å. When the metal is deposited in a thin layer, it may have a transflective characteristic that permits incident light to be both reflected and transmitted.

The upper layers 191Rr, 191Gr, and 191Br may be made of a transparent conductor such as polycrystalline ITO or IZO, and the thickness thereof is in the range of about 50-150 Å, and particularly about 75 Å.

The lower layers 191Rp, 191Gp, and 191Bp, the middle layers 191Rq, 191Gq, and 191Bq, and the upper layers 191Rr, 191Gr, and 191Br have a substantially planar shape, and accordingly the side surfaces thereof are exposed.

Auxiliary electrodes 193R, 193G, and 193B are formed on the pixel electrodes 191R, 191G, and 191B and the overcoat 250. The auxiliary electrodes 193R, 193G, and 193B may be made of a metal oxide such as amorphous ITO or amorphous IZO, and the thickness thereof is in the range of about 700-800 Å, and particularly about 750 Å.

The auxiliary electrodes 193R, 193G, and 193B respectively cover the side surfaces of the pixel electrodes 191R, 191G, and 191B, particularly the side surfaces of the middle layer 191Rq, 191Gq and 191Bq, thereby protecting them. The auxiliary electrodes 193R and 193B of the red pixel RP and the blue pixel BP cover the edge of the upper surface as well as the side surface of the pixel electrodes 191R and 191B, however they do not cover the central portions of the upper surface. However, the auxiliary electrode 193G of the green pixel GP covers all of the side surface and the upper surface of the pixel electrode 191G.

A conductive protection member (not shown) that may cover the side surface of the pixels RP, GP, and BP, and a light path length control electrode disposed on the upper surface of the green pixel GP may be separately formed.

A partition 361 is formed on the auxiliary electrode 193R, 193G, and 193B, the pixel electrodes 191R and 191B, and the overcoat 250. The partition 361 has openings 365R and 365B exposing the pixel electrodes 191R and 191B of the red pixel RP and the blue pixel BP, and an opening 365G exposing the auxiliary electrode 193G of the green pixel GP. The auxiliary electrodes 193R and 193B of the red pixel RP and the blue pixel BP are covered by the partition 361, and are thereby not exposed.

A white organic light emitting member 370 is formed on the pixel electrodes 191R and 191B, the auxiliary electrode 193G, and the partition 361, and a common electrode 270 transmitting a common voltage Vss is formed thereon.

The white organic light emitting member 370 may have a structure in which a plurality of organic materials emitting different colors among the primary colors are deposited, and the common electrode 270 may be made of a reflective metal such as Ca, Ba, Mg, and Al.

In the organic light emitting device according to the present exemplary embodiment, the pixel electrodes 191R, 191G, and 191B, the white organic light emitting member 370, and the common electrode 270 form an organic light emitting diode LD having the pixel electrodes 191R, 191G, and 191B as anodes and the common electrode 270 as a cathode.

In the organic light emitting device according to the present exemplary embodiment, light emitted from the white organic light emitting member 370 passes through the substrate 110, thereby displaying the images. In the white organic light emitting member 370, light emitted toward the substrate 110 passes through the auxiliary electrode 193G (only corresponding to the green pixel GP) and the upper layers 191Rr, 191Gr, and 191Br of the pixel electrodes 191R, 191G, and 191B, and arrives at the middle layers 191Rq, 191Gq, and 191Bq. The middle layers 191Rq, 191Gq, and 191Bq reflect incident light toward the common electrode 270, and the common electrode 270 again reflects the light to output it toward the middle layers 191Rq, 191Gq, and 191Bq. The light reciprocating between the middle layers 191Rq, 191Gq, and 191Bq, and the common electrode 270, is subject to an optical process such as interference, and passes through the middle layers 191Rq, 191Gq, and 191Bq and the color filters 230R, 230G, and 230B to the outside if appropriate conditions are satisfied.

Here, the path of the light is varied according to the thickness and the refractive index of thin films between the middle layers 191Rq, 191Gq, and 191Bq and the common electrode 270 such that desired optical characteristics, for example the wavelength and the color purity of the desired range, may be obtained by appropriately selecting the thickness of and the materials that make up the thin films.

When determining the thickness of the upper layers 191Rr, 191Gr, and 191Br, it may be difficult to determine the thickness for obtaining the desired optical characteristics for all pixels RP, GP, and BP, so instead the thickness of the red pixel RP and the blue pixel BP is determined, which may improve obtaining the desired optical characteristics thereof. Then, the auxiliary electrode 193G, having the appropriate thickness to obtain the desired optical characteristic for the green pixel GP, is formed on the upper layer 191Gr. The desired optical characteristics for all three pixels RP, GP, and BP may be obtained using this method.

A method of manufacturing an organic light emitting device shown in FIG. 2 will be described below with reference to FIG. 3, FIG. 4, FIG. 5, and FIG. 6.

FIG. 3, FIG. 4, FIG. 5, and FIG. 6 are cross-sectional views showing structures in intermediate steps for manufacturing the organic light emitting device shown in FIG. 2.

Figure 3:
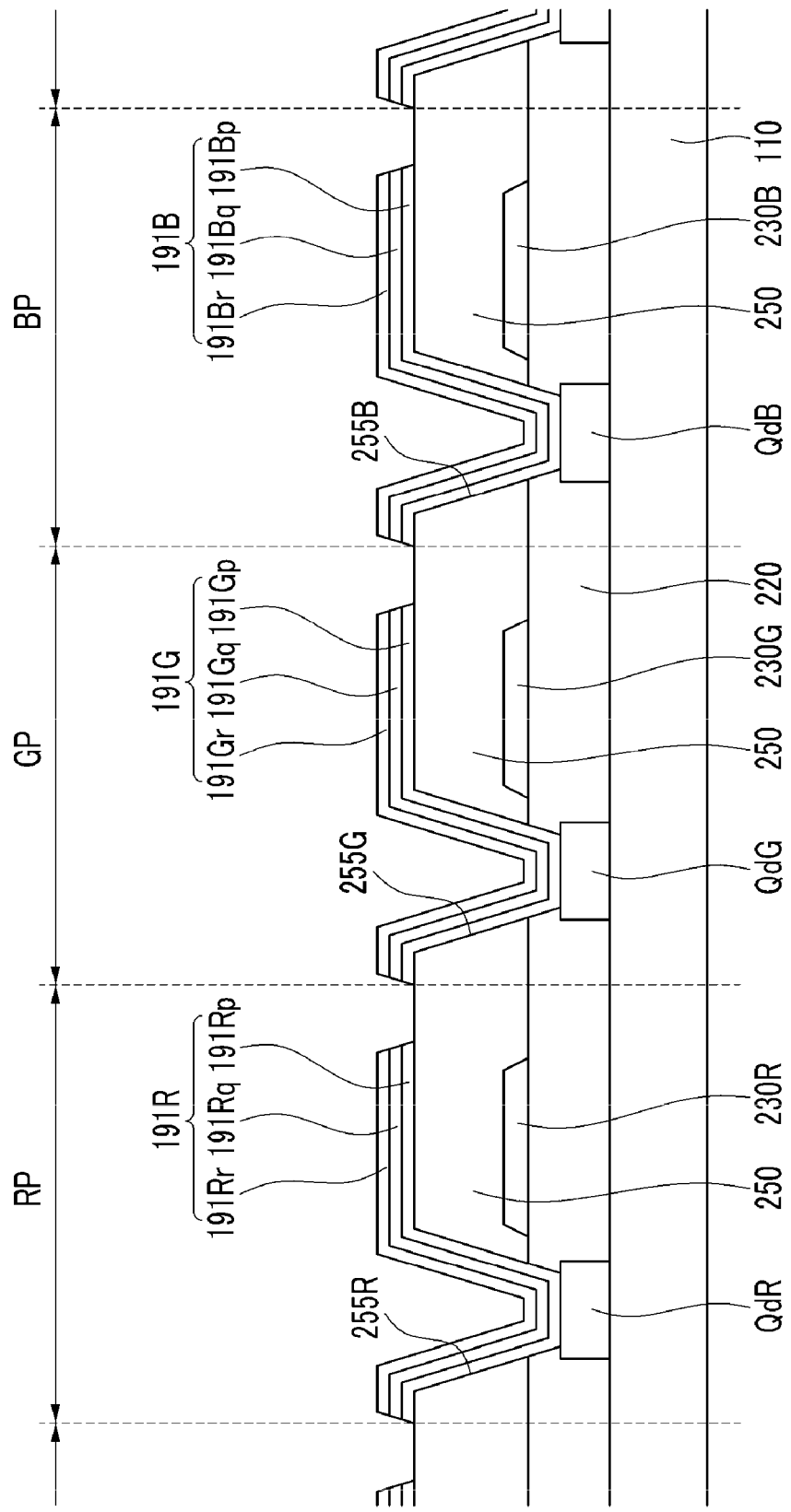
FIG. 3, FIG. 4, FIG. 5, and FIG. 6 are cross-sectional views showing structures in intermediate steps for manufacturing the organic light emitting device shown in FIG. 2.

Referring to FIG. 3, a plurality of driving transistors QdR, QdG, and QdB, thin film structures 220, and a plurality of color filters 230R, 230G, and 230B are formed on a substrate 110, and an overcoat 250 made of a photosensitive organic material is coated, exposed, and developed to form a plurality of through holes 255R, 255G, and 255B in the overcoat 250 and the thin film structures 220.

Next, an amorphous ITO or amorphous IZO layer, a metal layer such as a silver layer, and another amorphous ITO or amorphous IZO layer are deposited and patterned by photolithography to form pixel electrodes 191R, 191G, and 191B including lower layers 191Rp, 191Gp, and 191Bp, middle layers 191Rq, 191Gq, and 191Bq, and upper layers 191Rr, 191Gr, and 191Br, and heat treatment is used to crystallize the amorphous ITO or the amorphous IZO layers and form polycrystalline ITO or polycrystalline IZO.

Figure 4:
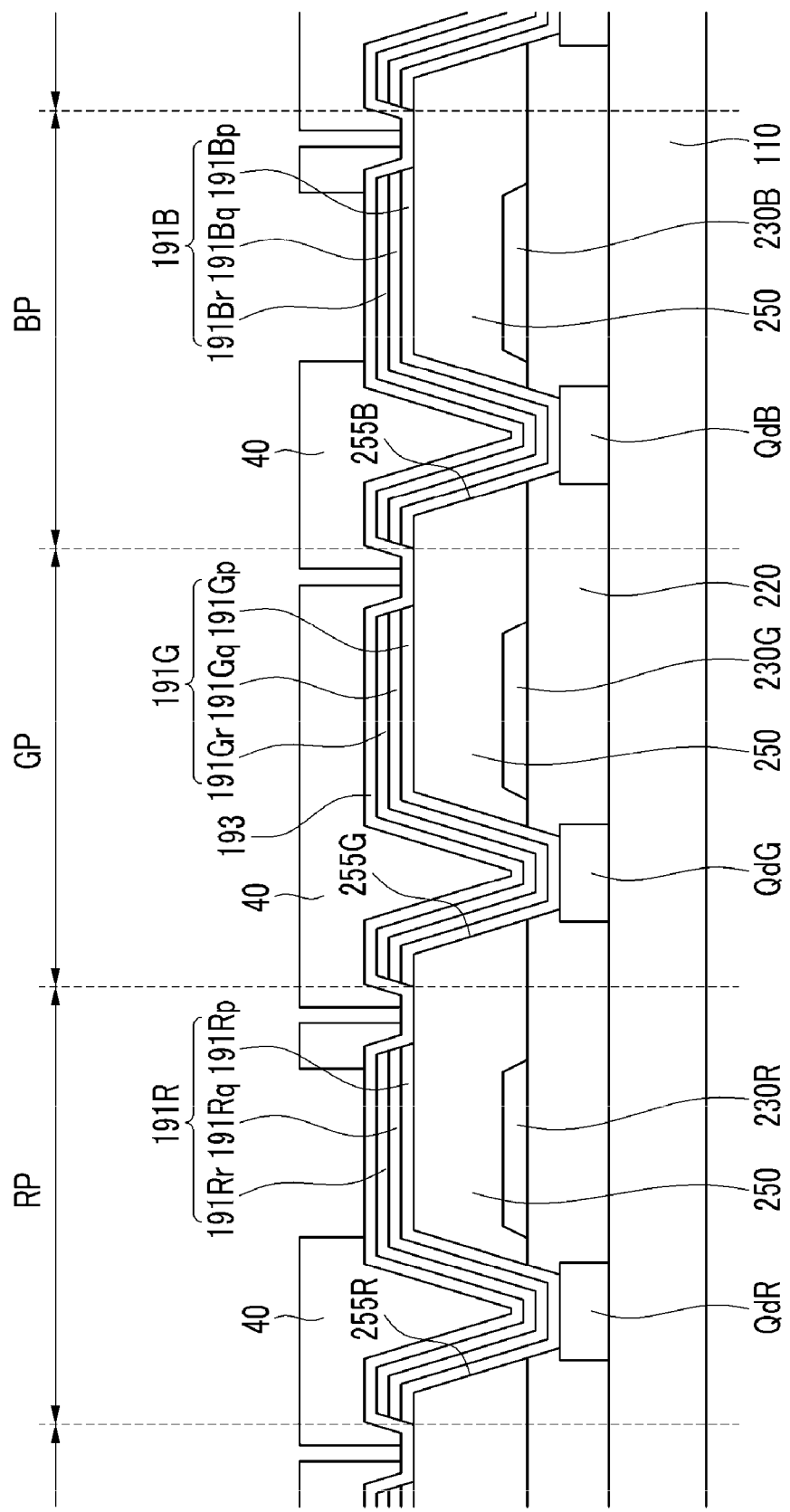
Figure 5:
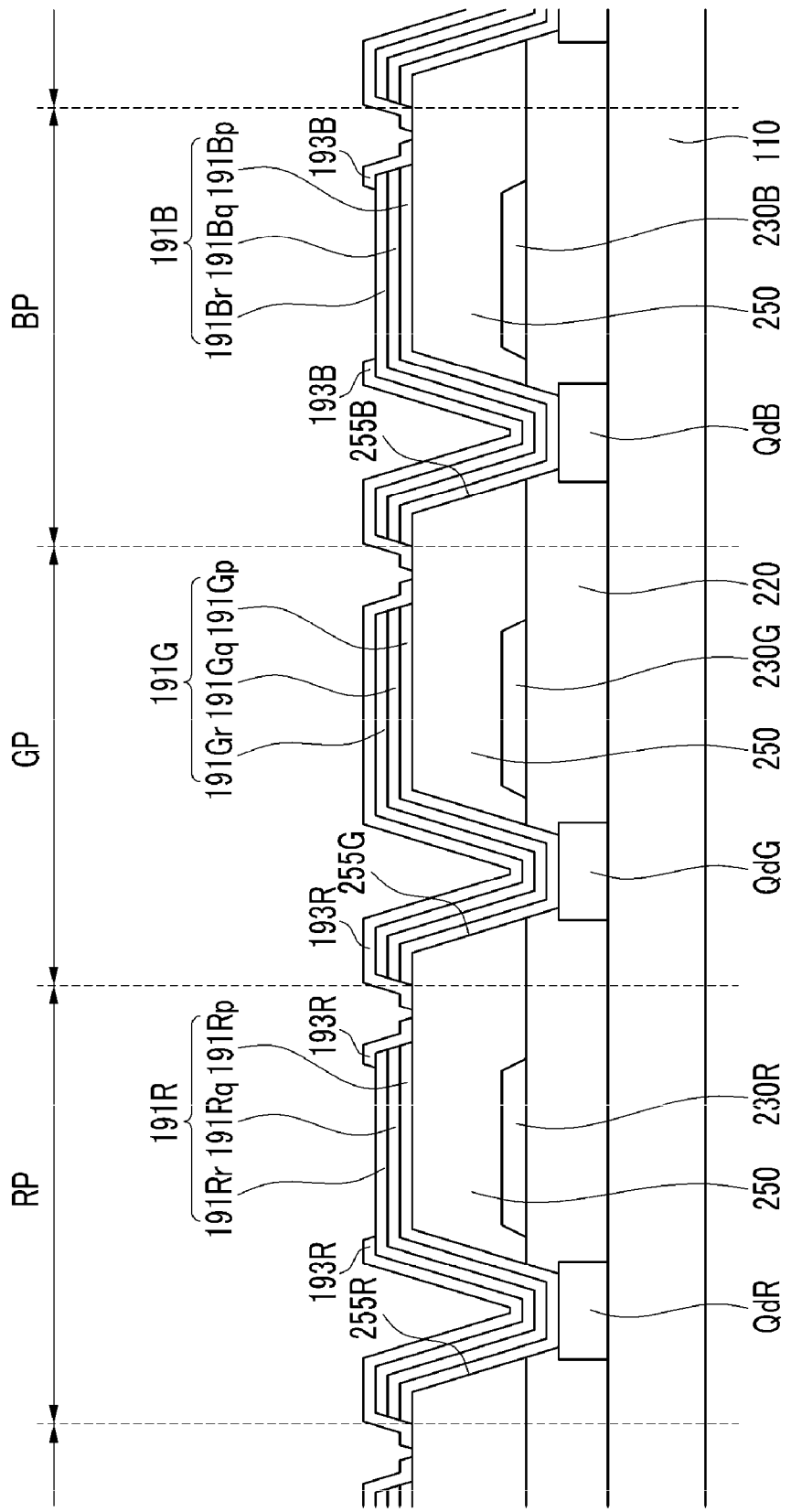

Referring to FIG. 4, amorphous ITO or amorphous IZO is deposited to form a transparent conductor layer 193, and a photosensitive film 40 is formed thereon. The photosensitive film 40 covers the side surfaces of the pixel electrodes 191R, 191G, and 191B, particularly the side surfaces of the middle layers 191Rq, 191Gq, and 191Bq. Referring to FIG. 5, the transparent conductor layer 193 is wet-etched using the photosensitive film 40 as a mask to form auxiliary electrodes 193R, 193G, and 193B, and the photosensitive film 40 is removed using a stripping solution. Here, the etchant has characteristics so that it etches the amorphous ITO or the amorphous IZO and does not etch the polycrystalline ITO or the polycrystalline IZO. Accordingly, the upper layers 191Rr, 191Gr, and 191Br of the pixel electrodes 191R, 191G, and 191B are not etched in this process.

However, the metal forming the middle layers 191Rq, 191Gq, and 191Bq of the pixel electrodes 191R, 191G, and 191B, particularly the silver, has weak physical and chemical characteristics such that the silver is sensitive to most etchants used when etching the transparent conductor layer 193. Also, the middle layers 191Rq, 191Gq, and 191Bq are sensitive to most stripping solutions used when stripping the photosensitive film 40, and may therefore be susceptible to corrosion. Accordingly, in the present exemplary embodiment, the middle layers 191Rq, 191Gq, and 191Bq of the pixel electrodes 191R, 191G, and 191B are covered by the photosensitive film 40 and the underlying transparent conductor layer 193 so that damage such as corrosion may be prevented.

Figure 6:
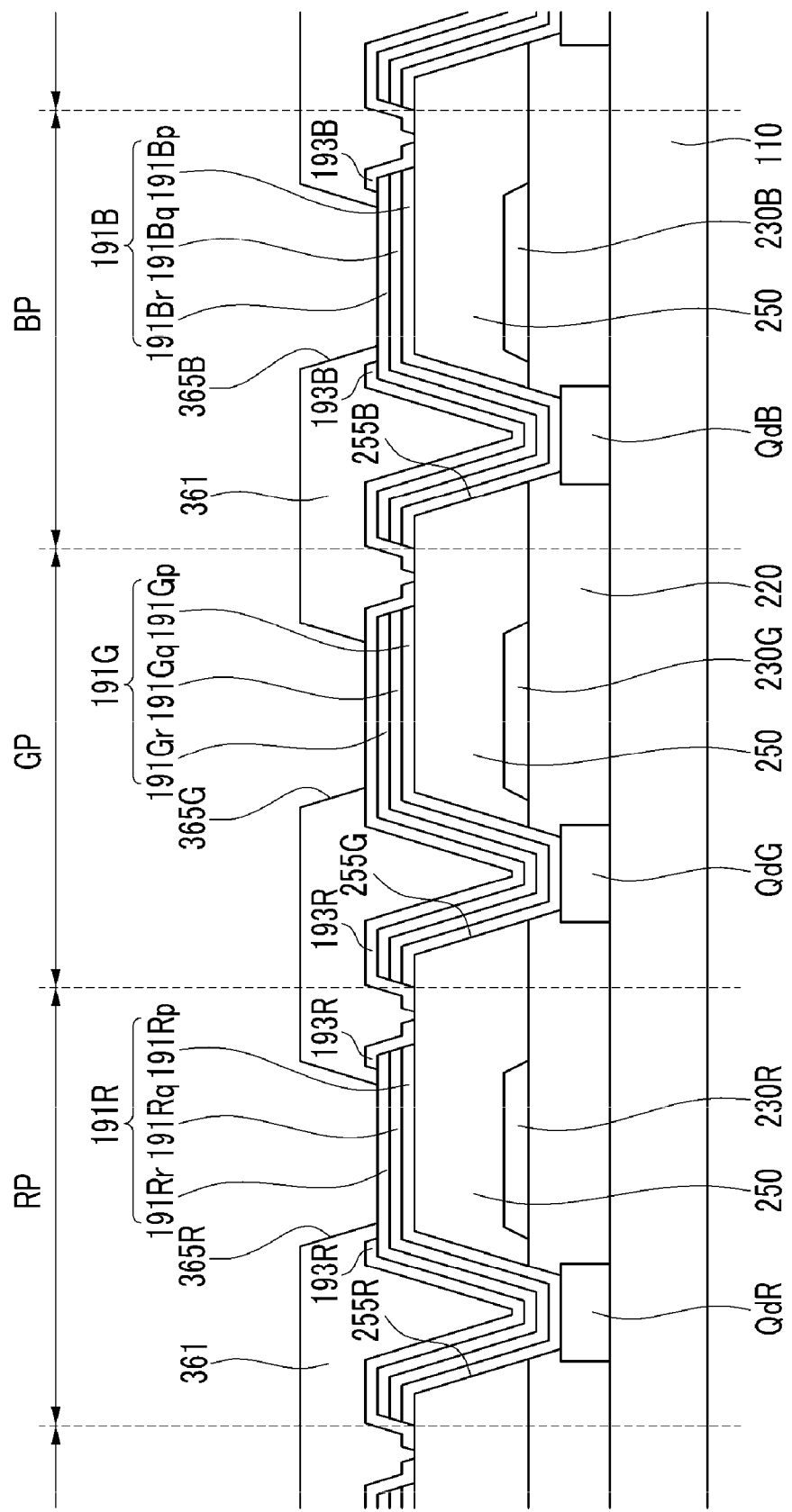

Referring to FIG. 6, an organic material is coated, exposed, and developed to form a partition 361 having openings 365R, 365G, and 365B.

Finally, as shown in FIG. 2, a white organic light emitting member 370 and a common electrode 270 are sequentially formed.

Next, a method of manufacturing the organic light emitting device according to an exemplary embodiment of the present invention will be described with reference to FIG. 7, FIG. 8, FIG. 9, FIG. 10, FIG. 11, FIG. 12, and FIG. 13 as well as FIG. 2.

FIG. 7, FIG. 8, FIG. 9, FIG. 10, FIG. 11, FIG. 12, and FIG. 13 are cross-sectional views showing structures in an intermediate step for manufacturing the organic light emitting device shown in FIG. 2 according to an exemplary embodiment of the present invention.

Figure 7:
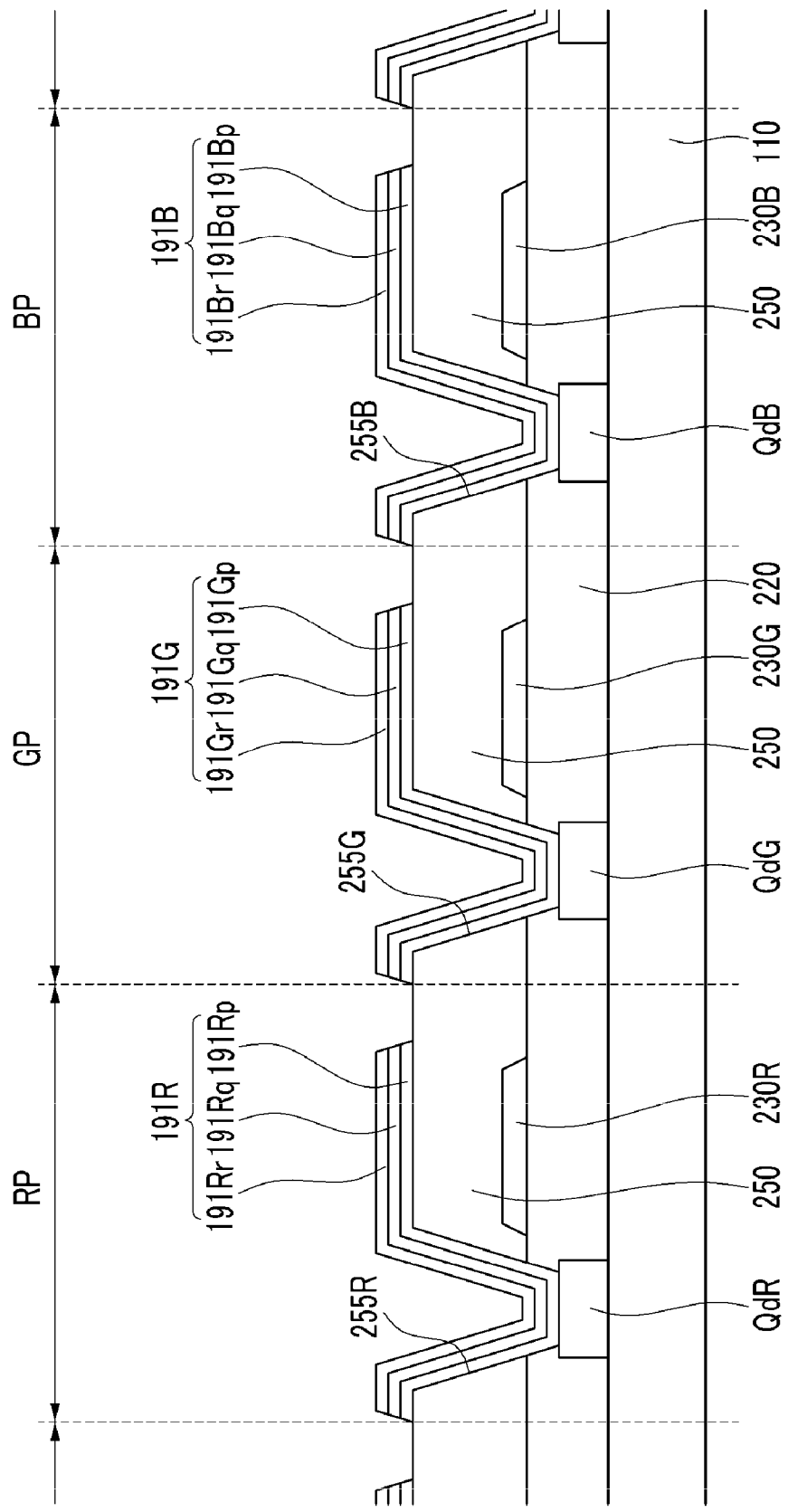
FIG. 7, FIG. 8, FIG. 9, FIG. 10, FIG. 11, FIG. 12, and FIG. 13 are cross-sectional views showing structures in intermediate steps for manufacturing the organic light emitting device shown in FIG. 2, according to an exemplary embodiment of the present invention.

Referring to FIG. 7, a plurality of driving transistors QdR, QdG, and QdB, thin film structures 220, and a plurality of color filters 230R, 230G, and 230B are formed on a substrate 110, and an overcoat 250 made of a photosensitive organic material is coated, exposed, and developed to form a plurality of through holes 255R, 255G, and 255B in the overcoat 250 and the thin film structures 220.

Next, an amorphous ITO or amorphous IZO layer, a metal layer such as a silver layer, and another amorphous ITO or amorphous IZO layer are deposited and patterned by photolithography to form pixel electrodes 191R, 191G, and 191B including lower layers 191Rp, 191Gp, and 191Bp, middle layers 191Rq, 191Gq, and 191Bq, and upper layers 191Rr, 191Gr, and 191Br, and heat treatment is used to crystallize the amorphous ITO or the amorphous IZO layers.

Figure 8:
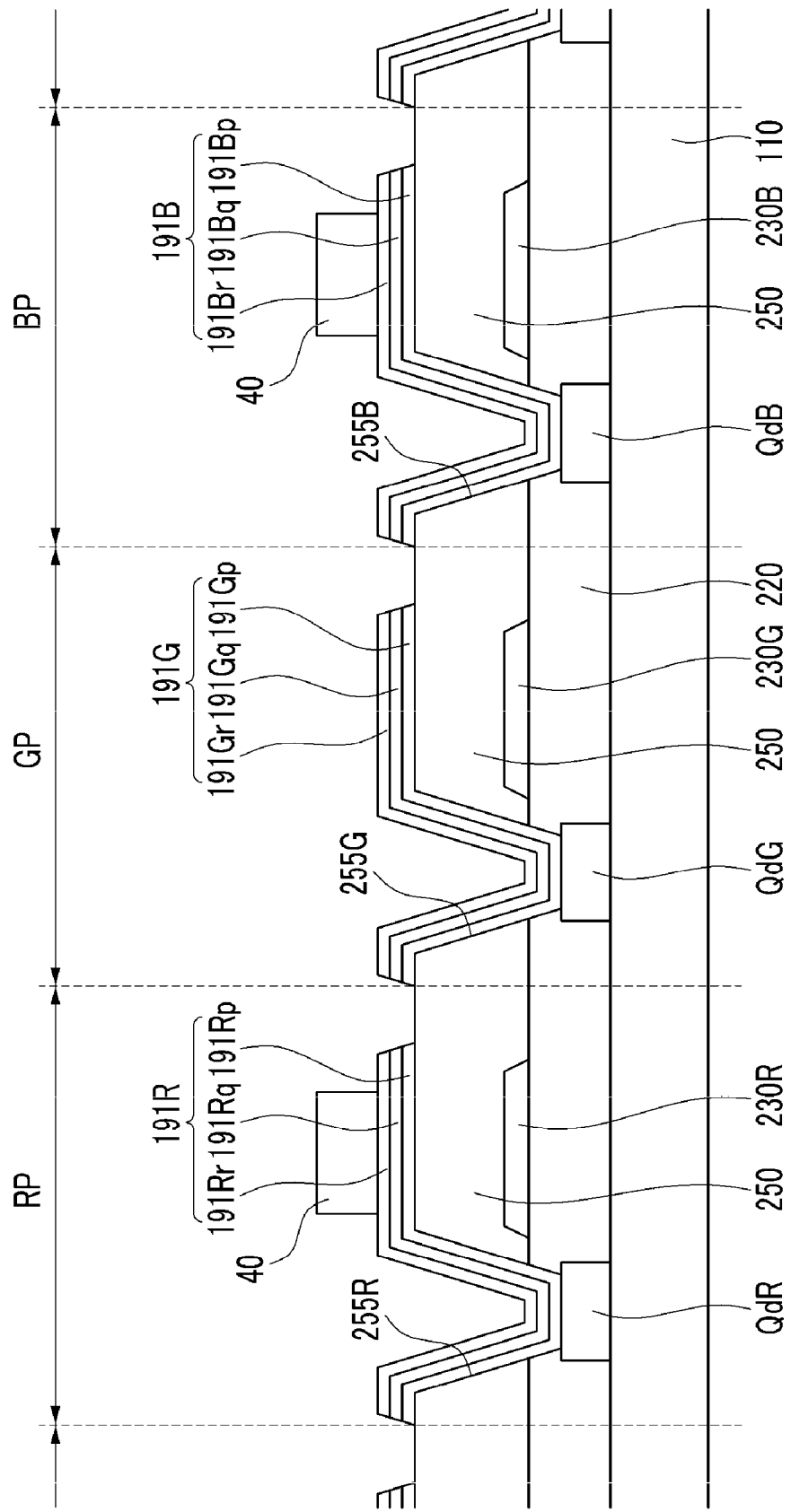

Referring to FIG. 8, the first photosensitive film 40 is formed on the upper layers 191Rr and 191Br of the pixel electrodes 191R and 191B. The first photosensitive film 40 covers the central portion of the upper surface of the pixel electrodes 191R and 191B of the red pixel RP and the blue pixel BP, however it does not cover the edge of the upper surface thereof and the side surface thereof, and is not disposed on the pixel electrode 191G of the green pixel GP.

Figure 9:
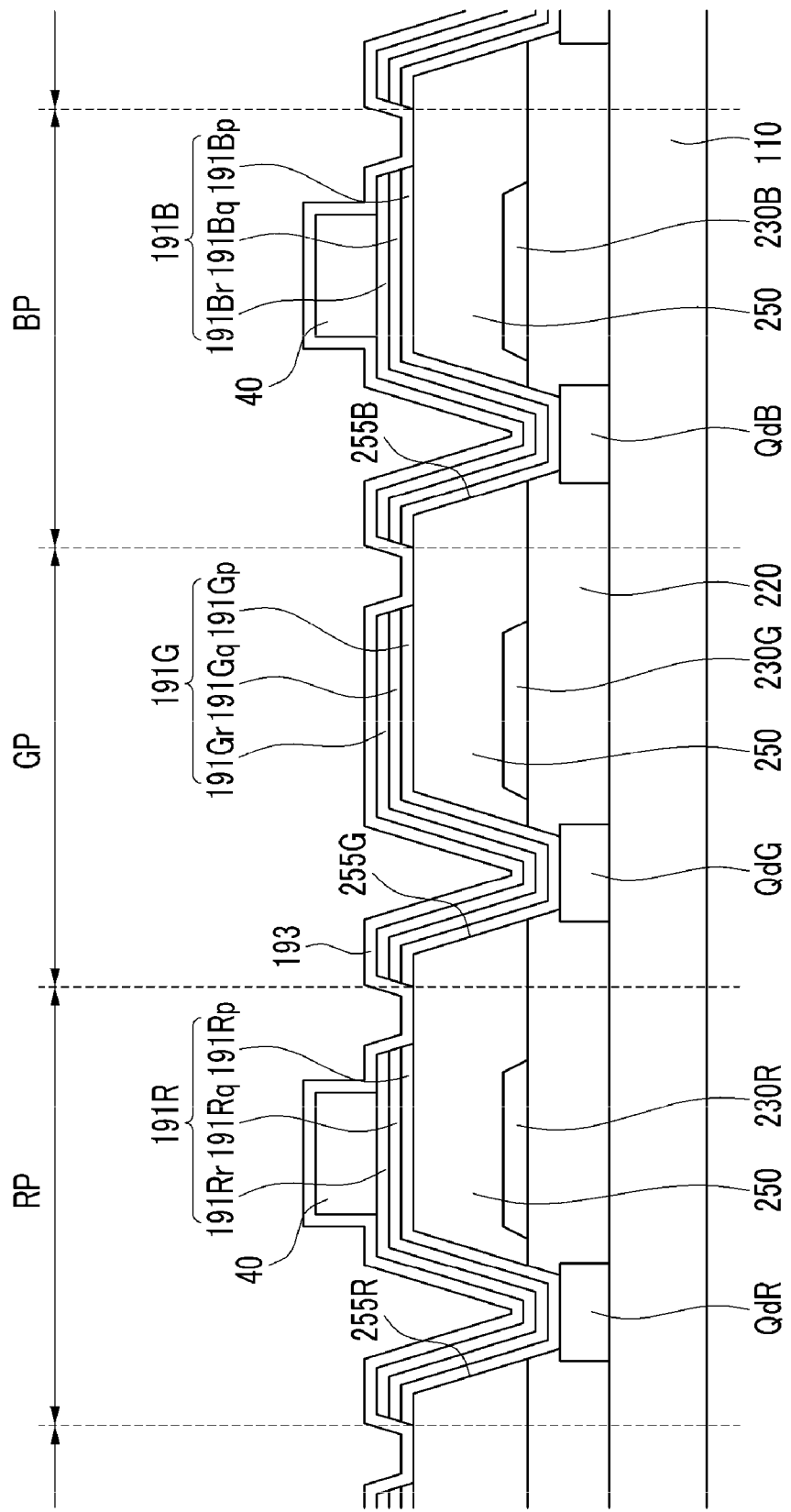

Referring to FIG. 9, a transparent conductor layer 193 is deposited on the upper layers 191Rr, 191Gr, and 191Br of the pixel electrode 191R, 191G, and 191B, and the first photosensitive film 40. The transparent conductor layer 193 covers the first photosensitive film 40 and exposed areas of the upper layers 191Rr, 191Gr, and 191Br of the pixel electrode 191R, 191G, and 191B, in other words, those areas that are not covered by the first photosensitive film 40.

Figure 10:
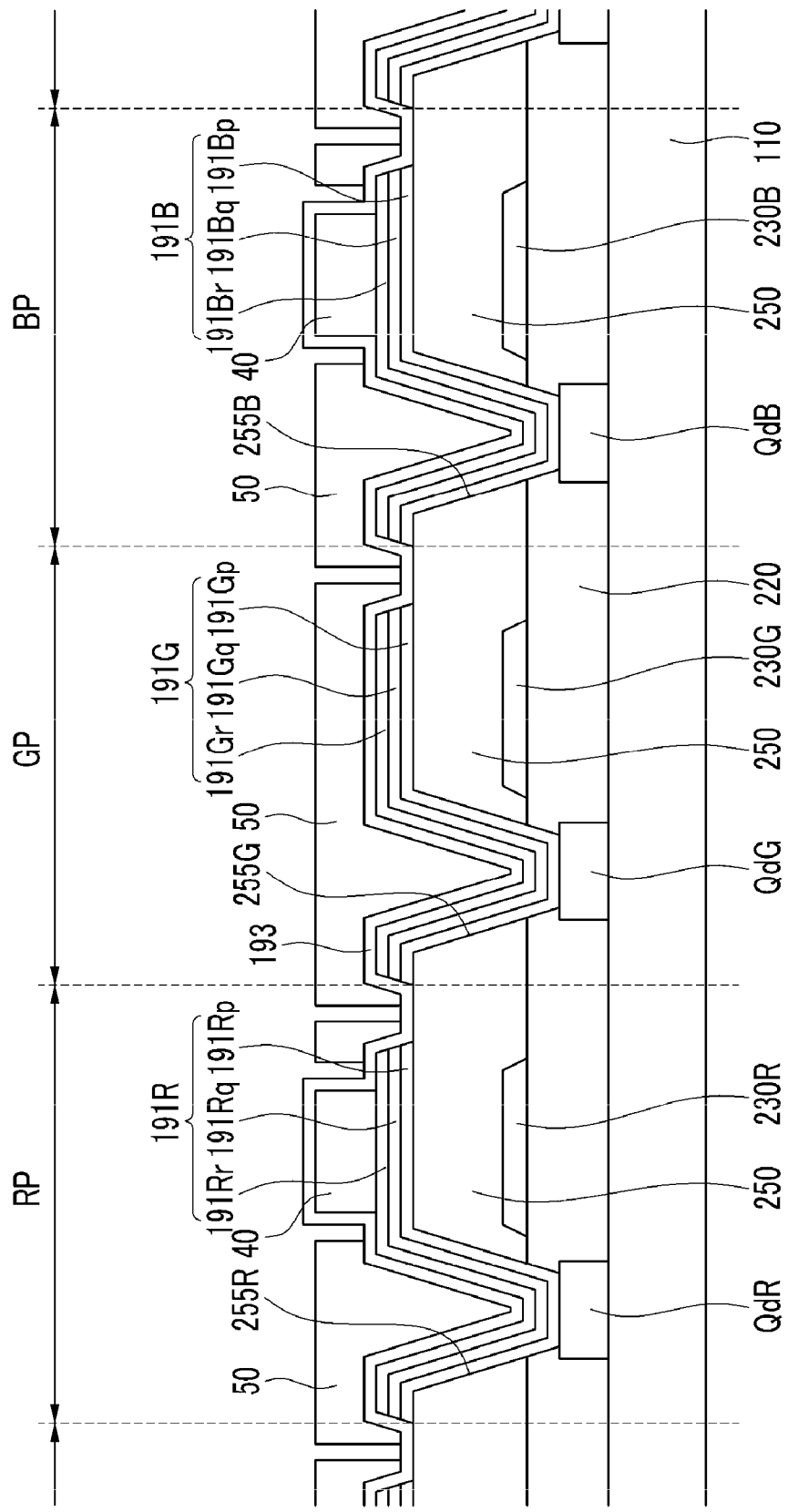

Referring to FIG. 10, a second photosensitive film 50 is formed on the transparent conductor 193. The second photosensitive film 50 covers the edges of the upper surface and the side surface of the pixel electrodes 191R and 191B of the red pixel RP and the blue pixel BP, however it does not cover the central portion of the upper surfaces of those pixel electrodes, and covers the side and upper surface of the pixel electrode 191G of the green pixel GP.

Figure 11:
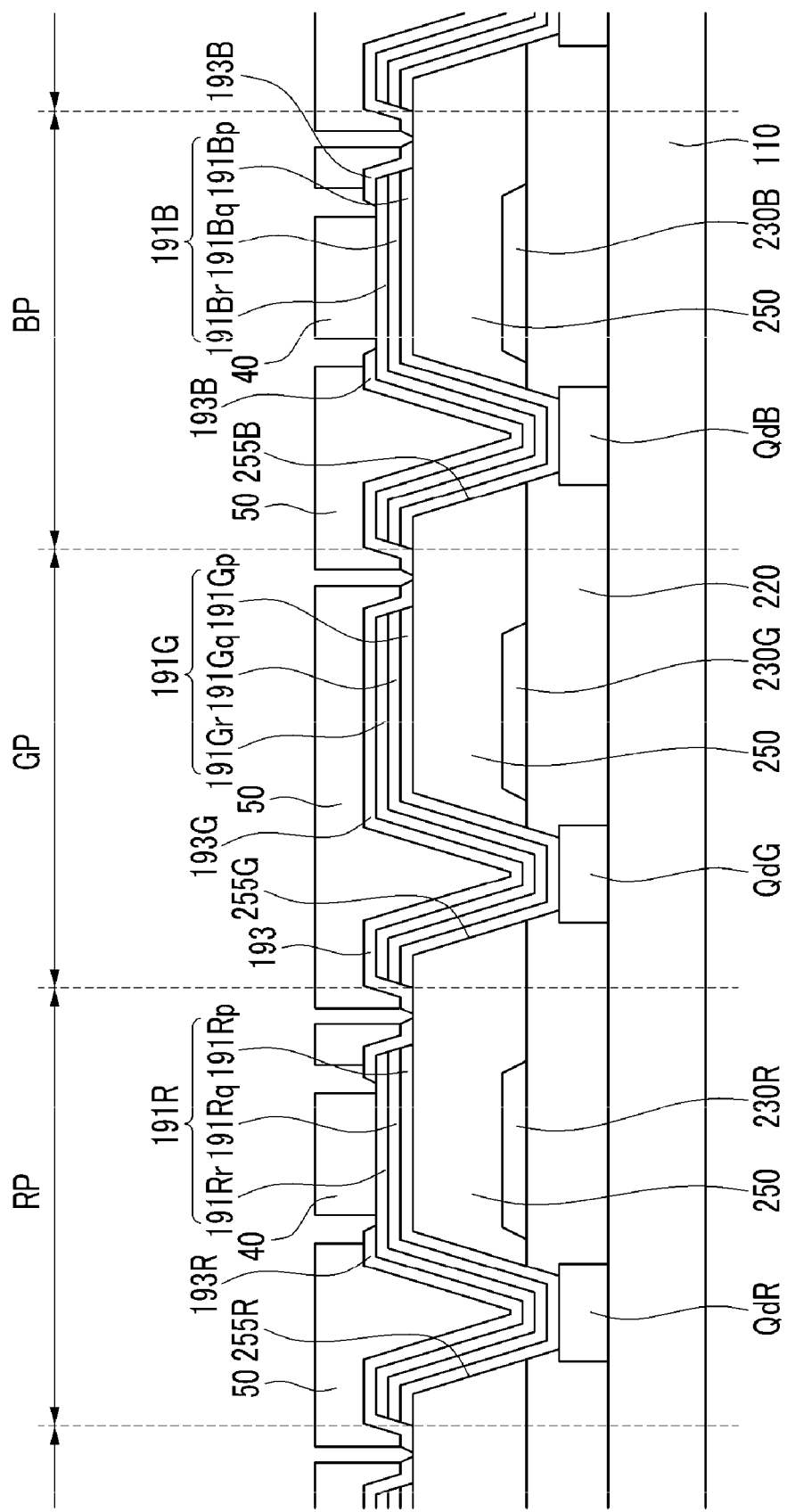

Referring to FIG. 11, the transparent conductor layer 193 is wet etched using the second photosensitive film 50 as a mask to form auxiliary electrodes 193R, 193G, and 193B. Here, the first photosensitive film 40 covers the central portion of the pixel electrodes 191R and 191B of the red pixel RP and the blue pixel BP so that the upper layers 191Rr and 191Br of the pixel electrodes 191R and 191B are not etched during the wet etching. Accordingly, the upper layers 191Rr and 191Br of the pixel electrodes 191R and 191B made of the polycrystalline ITO or the polycrystalline IZO may be prevented from being damaged by the wet-etchant.

Figure 12:
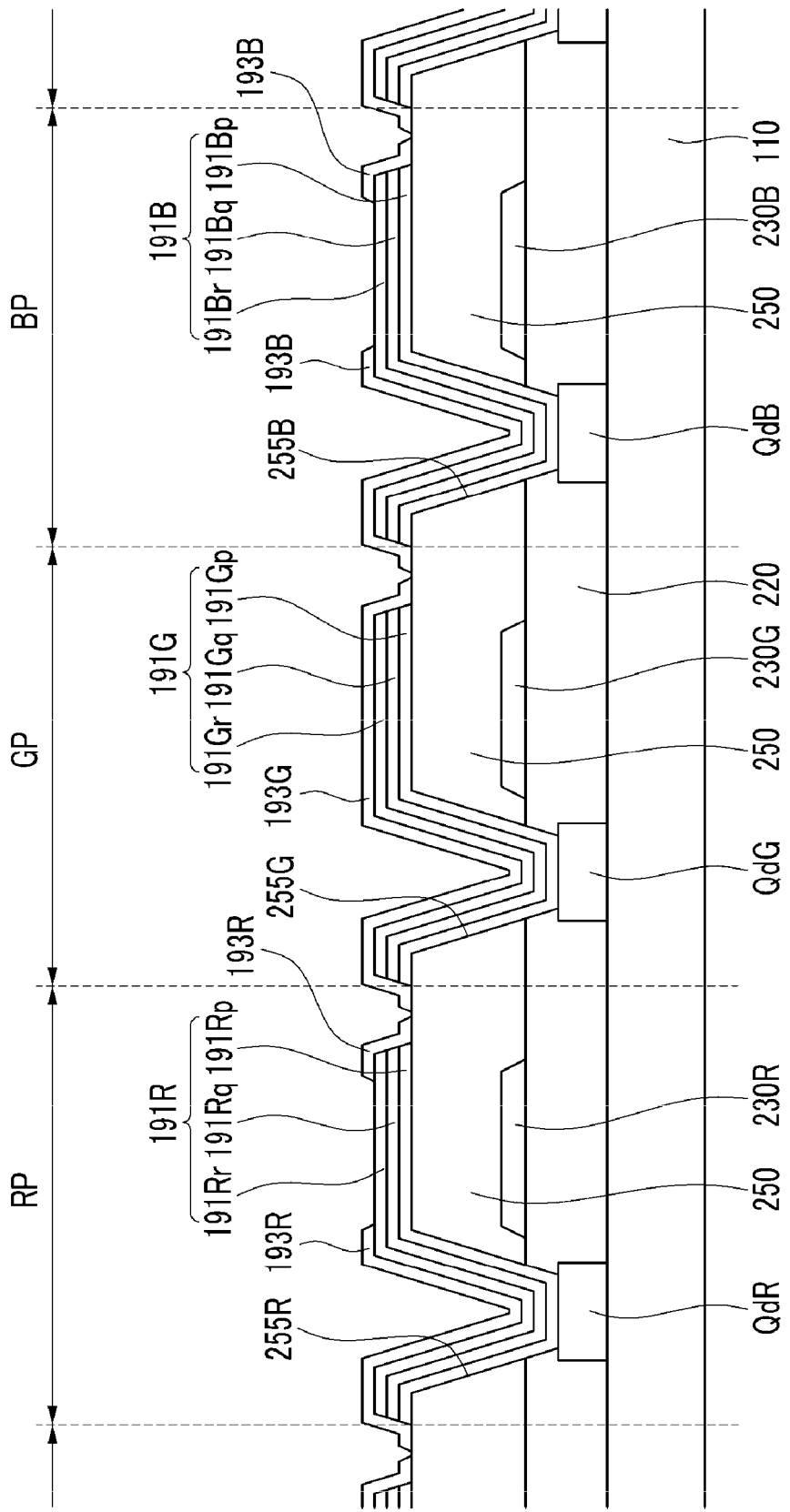

Referring to FIG. 12, the first photosensitive film 40 and the second photosensitive film 50 are stripped using a stripping solution. The pixel electrode 191G is completely covered by the auxiliary electrode 193G. Also, the upper layers 191Rr and 191Br of the pixel electrodes 191R and 191B are not damaged during the wet-etching step. The middle layers 191Rq and 191Bq are covered by the upper layers 191Rr and 191Br so that the metal that makes up the middle layers 191Rq and 191Bq of the pixel electrodes 191R and 191B, which may have weak physical and chemical characteristics, particularly the silver, may be prevented from being damaged.

Figure 13:
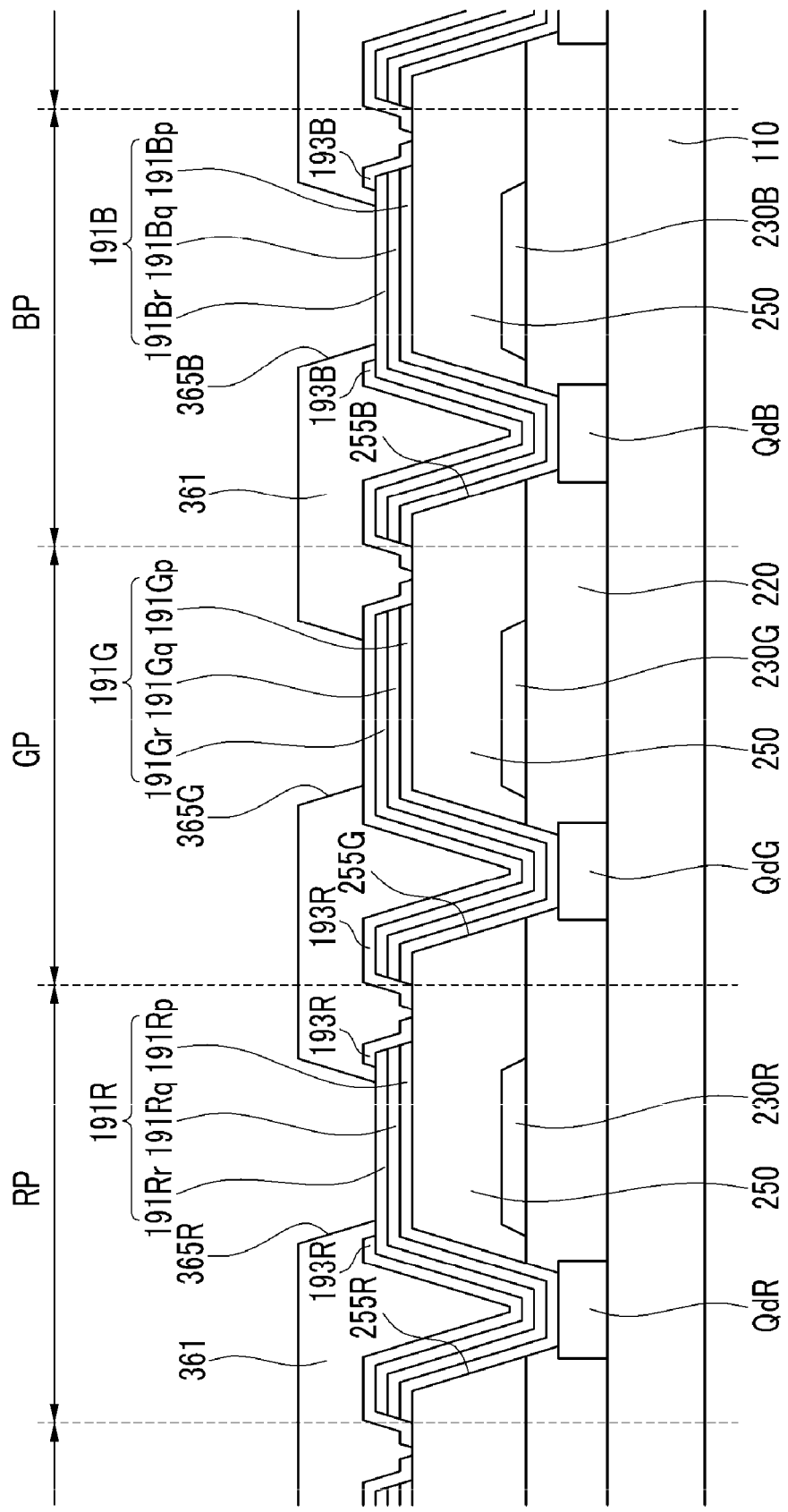

Referring to FIG. 13, an organic material is coated, exposed, and developed to form a partition 361 having openings 365R, 365G, and 365B.

Finally, as shown in FIG. 2, a white organic light emitting member 370 and a common electrode 270 are sequentially formed.

Figure 14:
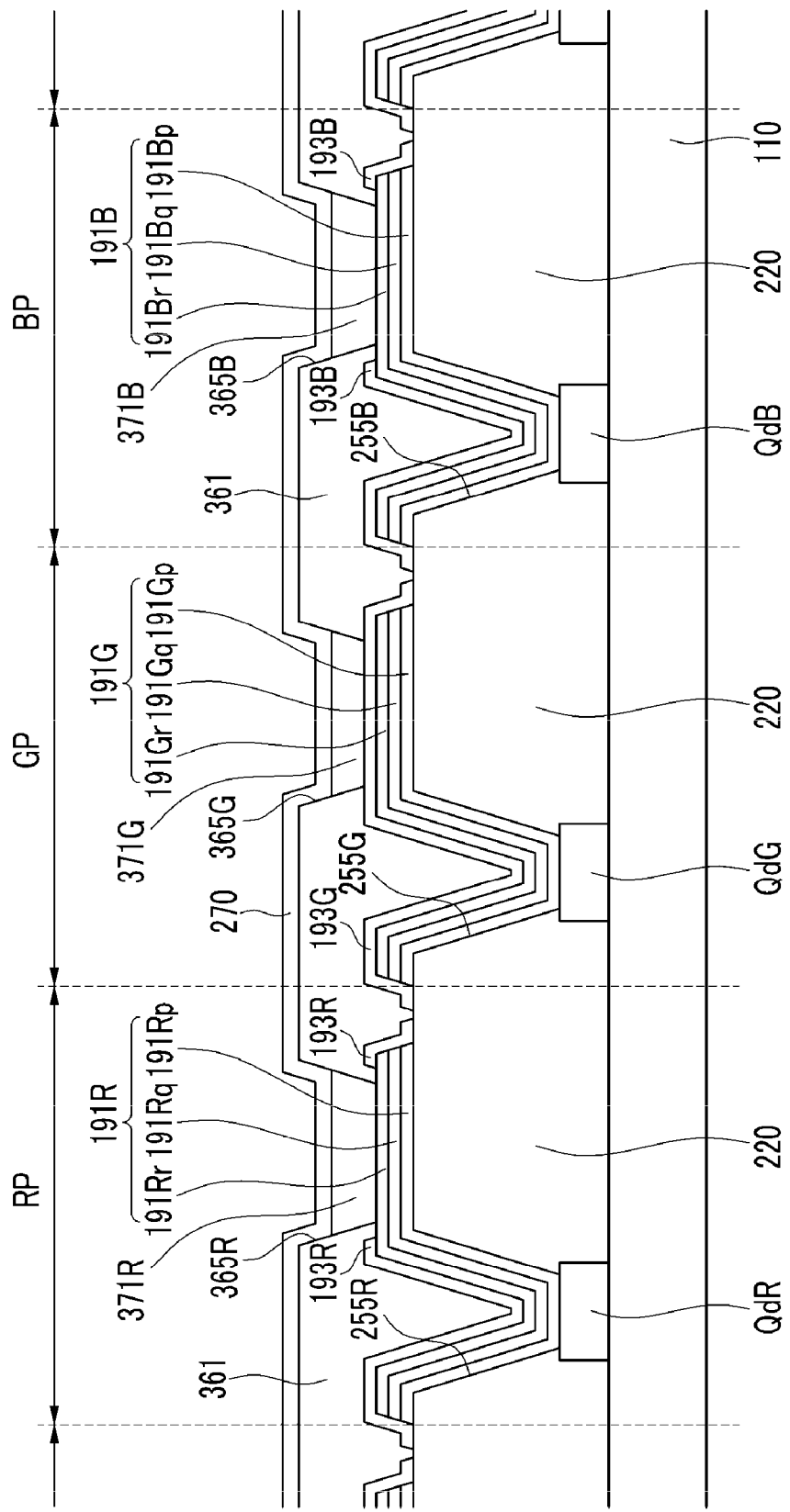
FIG. 14 is a cross-sectional view showing an organic light emitting device according to an exemplary embodiment of the present invention.

FIG. 14 is a cross-sectional view of an organic light emitting device according to an exemplary embodiment of the present invention.

The organic light emitting device shown in FIG. 14 has a similar cross-section to the organic light emitting device shown in FIG. 2. A plurality of driving transistors QdR, QdG, and QdB and thin film structures 220 are formed on a substrate 110, and a plurality of pixel electrodes 191R, 191G, and 191B are formed thereon. Each pixel electrode 191R, 191G, and 191B has a three-layered structure including lower layers 191Rp, 191Gp, and 191Bp, middle layers 191Rq, 191Gq, and 191Bq, and upper layers 191Rr, 191Gr, and 191Br. The pixel electrodes 191R, 191G, and 191B are connected to the driving transistors QdR, QdG, and QdB through the through holes 255R, 255G, and 255B. Auxiliary electrodes 193R, 193G, and 193B are formed on the pixel electrodes 191R, 191G, and 191B, and the thin film structures 220, and a partition 361 having openings 365R, 365B, and 365G is formed thereon.

Organic light emitting members 371R, 371G, and 371B are formed on the pixel electrodes 191R and 191B and the auxiliary electrode 193G exposed through the openings 365R, 365B, and 365G of the partition 361. A red organic light emitting member 371R is disposed on the pixel electrode 191R, a blue organic light emitting member 371B is disposed on the pixel electrode 191B, and a green organic light emitting member 371G is disposed on the auxiliary electrode 193G. A common electrode 270 is formed on the organic light emitting member 371R, 371G, and 371B and the partition 361.

The present invention may also be applied to an organic light emitting device having a different structure, for example a top emission organic light emitting device.

Accordingly, the photo-characteristics of the organic light emitting device may be improved, and damage to the metal layer during a manufacturing process may be prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
   a substrate comprising a first region, a second region, and a third region;
   a first driving transistor, a second driving transistor, and a third driving transistor arranged on the substrate and respectively disposed in the first region, the second region, and the third region;
   an insulating layer arranged on the first driving transistor, the second driving transistor, and the third driving transistor;
   a first pixel electrode, a second pixel electrode, and a third pixel electrode arranged on the insulating layer, and respectively disposed in the first region, the second region, and the third region;
   a first auxiliary electrode, a second auxiliary electrode, and a third auxiliary electrode respectively covering a side wall of the first pixel electrode, the second pixel electrode, and the third pixel electrode;
   an organic light emitting member arranged on the first pixel electrode, the second pixel electrode, and the third pixel electrode; and
   a common electrode arranged on the organic light emitting member.

2. The organic light emitting device of claim 1, further comprising:
   a light path length control electrode arranged on at least one of the first pixel electrode, the second pixel electrode, and the third pixel electrode.

3. The organic light emitting device of claim 2, wherein the auxiliary electrode comprises amorphous indium tin oxide (ITO) or amorphous indium zinc oxide (IZO).

4. The organic light emitting device of claim 3, wherein a thickness of the auxiliary electrode is in the range of about 700 to about 800 Å.

5. The organic light emitting device of claim 2, wherein a thickness of the auxiliary electrode is in the range of about 700 to about 800 Å.

6. The organic light emitting device of claim 1, wherein the auxiliary electrode comprises amorphous indium tin oxide (ITO) or amorphous indium zinc oxide (IZO).

7. The organic light emitting device of claim 6, wherein a thickness of the auxiliary electrode is in the range of about 700 to about 800 Å.

8. The organic light emitting device of claim 1, wherein a thickness of the auxiliary electrode is in the range of about 700 to about 800 Å.

9. The organic light emitting device of claim 1, wherein the first pixel electrode, the second pixel electrode, and the third pixel electrode each comprise a metal layer and a transparent conductor layer arranged on the metal layer.

10. The organic light emitting device of claim 9, wherein the metal layer comprises silver or aluminum.

11. The organic light emitting device of claim 2, wherein the light path length control electrode is contacted with at least one of the first auxiliary electrode, the second auxiliary electrode and the third auxiliary electrode.

12. The organic light emitting device of claim 9, wherein the first pixel electrode, the second pixel electrode, and the third pixel electrode further comprise a metal oxide layer arranged under the metal layer.

13. The organic light emitting device of claim 12, wherein the transparent conductor layer, the metal layer, and the metal oxide layer all have the same planar shape.

14. The organic light emitting device of claim 1, further comprising:
   a color filter arranged between the first driving transistor, the second driving transistor, and the third driving transistor, and the pixel electrode.

15. A method for manufacturing an organic light emitting device, comprising:
   respectively forming a first driving transistor, a second driving transistor, and a third driving transistor in a first region, a second region, and a third region on a substrate;
   forming an insulating layer on the first driving transistor, the second driving transistor, and the third driving transistor;
   forming a first pixel electrode, a second pixel electrode, and a third pixel electrode on the insulating layer, the first pixel electrode, the second pixel electrode, and the third pixel electrode being formed in the first region, the second region, and the third region, respectively;
   forming an auxiliary electrode on a side wall of each of the first pixel electrode, the second pixel electrode, and the third pixel electrode;
   forming an organic light emitting member on the first pixel electrode, the second pixel electrode, and the third pixel electrode; and
   forming a common electrode on the organic light emitting member.

16. The method of claim 15, wherein
   forming the auxiliary electrode on the side wall of each of the first pixel electrode, the second pixel electrode, and the third pixel electrode comprises:
   depositing a first transparent conductor on the first pixel electrode, the second pixel electrode, and the third pixel electrode; and
   patterning the first transparent conductor.

17. The method of claim 15, further comprising:
   forming at least one light path length control electrode on the first pixel electrode, the second pixel electrode, and the third pixel electrode.

18. The method of claim 17, wherein the auxiliary electrode and the light path length control electrode are simultaneously formed.

19. The method of claim 18, wherein the auxiliary electrode comprises indium tin oxide (ITO) or indium zinc oxide (IZO).

20. The method of claim 19, wherein a thickness of the auxiliary electrode is in the range of about 700 to about 800 Å.

21. The organic light emitting device of claim 1, wherein each pixel electrode comprises a first, second, and third layer, and the auxiliary electrodes contact side walls of the first, second, and third layers and a top surface of the third layer.

22. The organic light emitting device of claim 1, wherein the first and third auxiliary electrodes expose central portions of the first and third pixel electrodes, respectively, and the second auxiliary electrode does not expose the central portion of the second pixel electrode.

23. The organic light emitting device of claim 1, wherein the organic light emitting member is arranged directly on only the second auxiliary electrode of the first, second, and third auxiliary electrodes.

24. The method of claim 15, wherein each pixel electrode comprises a first, second, and third layer, and the auxiliary electrodes contact side walls of the first, second, and third layers and a top surface of the third layer.

25. The method of claim 15, wherein the auxiliary electrode formed on the first and third pixel electrodes exposes central portions of the first and third pixel electrodes, respectively, and the auxiliary electrode formed on the second pixel electrode does not expose the central portion of the second pixel electrode.

26. The method of claim 15, wherein the organic light emitting member is arranged directly on only the auxiliary electrode formed on the second pixel electrode.

* * * * *